(12) United States Patent
Maruyama et al.

(10) Patent No.: US 8,469,760 B2
(45) Date of Patent: *Jun. 25, 2013

(54) LIGHT EMITTING DEVICE AND METHOD FOR PRODUCING SAME

(75) Inventors: Tsukasa Maruyama, Akita (JP); Masahiro Gotoh, Okayama (JP); Tetsuya Ikuta, Akita (JP)

(73) Assignee: Dowa Electronics Materials Co., Ltd., Tokyo (JP)

(*) Notice: Subject to any disclaimer, the term of this patent is extended or adjusted under 35 U.S.C. 154(b) by 796 days.

This patent is subject to a terminal disclaimer.

(21) Appl. No.: 11/691,509

(22) Filed: Mar. 27, 2007

(65) Prior Publication Data

US 2007/0228949 A1    Oct. 4, 2007

(30) Foreign Application Priority Data

Mar. 31, 2006  (JP) ................. 2006-096978
Mar. 31, 2006  (JP) ................. 2006-097307
Mar. 14, 2007  (JP) ................. 2007-064451
Mar. 14, 2007  (JP) ................. 2007-064916

(51) Int. Cl.
*B05D 5/06* (2006.01)

(52) U.S. Cl.
USPC .................. 445/23; 427/64; 445/58

(58) Field of Classification Search
USPC ............. 313/501, 512; 427/64, 66; 438/29; 445/23–25, 58
See application file for complete search history.

(56) References Cited

U.S. PATENT DOCUMENTS

| | | | | |
|---|---|---|---|---|
| 5,019,748 A | * | 5/1991 | Appelberg | 315/169.3 |
| 5,240,798 A | * | 8/1993 | Ehemann, Jr. | 430/23 |
| 5,477,285 A | * | 12/1995 | Riddle et al. | 396/546 |
| 5,874,135 A | * | 2/1999 | Yoon et al. | 427/560 |
| 6,252,254 B1 | * | 6/2001 | Soules et al. | 257/89 |
| 2003/0038292 A1 | * | 2/2003 | Wang et al. | 257/81 |
| 2005/0224821 A1 | * | 10/2005 | Sakano et al. | 257/79 |
| 2006/0227087 A1 | * | 10/2006 | Hajjar et al. | 345/84 |

FOREIGN PATENT DOCUMENTS

| | | |
|---|---|---|
| JP | 2000-244021 | 9/2000 |
| JP | 2001-127346 | 5/2001 |
| JP | 2003-101081 | 4/2003 |
| JP | 2003-318447 | 11/2003 |
| JP | 2004-152993 | 5/2004 |
| WO | WO02/059982 | 8/2002 |
| WO | WO 2005/029596 | 3/2005 |

* cited by examiner

*Primary Examiner* — Nimeshkumar Patel
*Assistant Examiner* — Steven Horikoshi
(74) *Attorney, Agent, or Firm* — Bachman & LaPointe, P.C.

(57) ABSTRACT

A light emitting device 10 includes: a lead frame 12a serving as a mounting portion having a cup 13; a light emitting element 14, mounted on the bottom face 13a of the cup, for emitting light having a predetermined peak wavelength; a layer of large phosphor particles 16, adsorbed and formed on the light emitting element, for absorbing light emitted from the light emitting element and for emitting light having a longer peak wavelength than that of the light emitted from the light emitting element; small phosphor particles 18, which have a smaller particle diameter than that of the large phosphor particles, for absorbing at least one of light emitted from the large phosphor particles and light emitted from the light emitting element and for emitting light having a longer peak wavelength than that of the at least one of the light emitted from the large phosphor particles and the light emitted from the light emitting element; and a sealing member 20, in which the small phosphor particles are dispersed, for sealing the light emitting element and the layer of large phosphor particles in the cup.

11 Claims, 11 Drawing Sheets

LIGHT EMITTING DEVICE AND METHOD FOR PRODUCING SAME

BACKGROUND OF THE INVENTION

1. Field of the Invention

The present invention generally relates to a light emitting device and a method for producing the same. More specifically, the invention relates to a light emitting device wherein a light emitting element is combined with a phosphor (or a fluorescent substance) which is designed to receive light from the light emitting element to emit light having a different wavelength from that of the light emitted from the light emitting element, and a method for producing the same.

2. Description of the Prior Art

In recent years, there has been actively developed a light emitting device for emitting white light by combining a light emitting element, such as a light emitting diode (LED) for emitting light in wavelength ranges from near ultraviolet to blue, with a phosphor (or a fluorescent substance) which is designed to receive light from the light emitting element to emit light having a different wavelength from that of the light emitted from the light emitting element. In such a white light emitting device, a LED chip is mounted on the bottom face of a cup-shaped recessed portion formed in a lead frame or a substrate, and a resin mixed with a phosphor, which is designed to absorb light from the LED chip to emit light having a longer wavelength than that of the light from the LED chip, is potted in the cup-shaped recessed portion to seal the LED chip therein.

If such a white light emitting device is used as a light source for illumination, it is desired that the device can emit light having a high emission power (a high illumination intensity or illuminance), a small irregularity in color, and good color rendering properties. In order to cause light from such a white light emitting device to be white light having good color rendering properties, it is proposed that a resin mixed with two kinds of phosphors for emitting light having different wavelengths by light from a LED chip is arranged around the LED chip (see, e.g., Japanese Patent Laid-Open Nos. 2000-244021, 2001-127346, 2003-101081, 2003-318447 and 2004-152993).

It is also proposed that a transparent or translucent resin containing large phosphor particles and small phosphor particles for absorbing at least part of light from a LED chip to emit light having different wavelengths is arranged around the LED chip, so that the large phosphor particles are distributed near the LED chip to form a color conversion layer to efficiently carry out color conversion while the small phosphor particles are distributed outside of the color conversion layer to suppress irregular color (see, e.g., WO02/059982).

Moreover, there is proposed a light emitting device for emitting white light by arranging a resin mixed with a YAG phosphor (a rare-earth aluminate phosphor activated by a rare earth element having a garnet structure), which is designed to emit light in wavelength ranges from green to yellow as a complementary color light with respect to light in the blue range, around a light emitting element which is designed to emit light in the blue range. There is also proposed a white light emitting device capable of realizing a luminescent color having higher color rendering properties by mixing a resin with a phosphor of $Ca_2Si_5N_8$:Eu or the like which is designed to emit light in wavelength ranges from orange to red (see, e.g., WO2005/029596).

In order to improve the luminance of a white light emitting device, large phosphor particles having a high light-transforming efficiency are preferably used as the phosphor particles. However, if a resin mixed with large phosphor particles is cured, the phosphor particles are easily precipitated in the resin while the resin is cured, so that the variation in amount of the phosphor particles is caused in the resin. For that reason, the quantity of light, the wavelength of which is converted by the phosphor particles, is changed every optical path through which light emitted from the LED passes, so that irregular color is caused.

If a resin having a high viscosity is used in order to prevent the precipitation of the phosphor particles, bubbles are mixed in the resin, so that light entering the bubbles is confined therein to deteriorate the emission power of the light emitting device. If a resin having a high viscosity is applied by means of a dispenser or the like, it is difficult to discharge the resin from a nozzle, so that it is difficult to control the amount of the resin to be applied. Therefore, there is a problem in that it is difficult to control the color temperature of the light emitting device.

On the other hand, if small phosphor particles are used as the phosphor particles, it is possible to prevent irregular color due to the precipitation of the phosphor particles in the resin. However, if the particle diameter of the phosphor particles decreases, the light-transforming efficiency generally deteriorates, so that there is a problem in that the emission power of the produced white light emitting device is deteriorated.

In addition, in a white light emitting device wherein a light emitting element is mounted on the bottom face of a cup-shaped recessed portion, which is formed in a lead frame or substrate, to be sealed with a resin containing phosphor particles by potting the resin, it is required that the optical path length, by which light emitted from the light emitting element passes through the resin, is constant in order to reduce the irregularity in color. In order to make it constant, it is required that the top face of a sealing member of a resin is raised to be convex so that the distance between the light emitting element and the surface of the sealing member is constant.

However, when the light emitting element arranged in the cup-shaped recessed portion is sealed with a resin by potting, it is not easy to control the shape of a sealing member of the resin so that the optical path length, by which light emitted from the light emitting element passes through the resin, is constant, due to the viscosity of the used resin and the gravity applied to the resin. As a result, the irregular color of light from the light emitting device is caused.

SUMMARY OF THE INVENTION

It is therefore an object of the present invention to eliminate the aforementioned problems and to provide a light emitting device which has a high emission power, a small irregularity in color and good color rendering properties, and a method for producing the same.

It is another object of the present invention to eliminate the aforementioned problems and to provide a light emitting device which has a high emission power, a small irregularity in color and good color rendering properties and which can reduce the irregularity in color regardless of the shape of a sealing member, and a method for producing the same.

In order to accomplish the aforementioned and other objects, according one aspect of the present invention, there is provided a method for producing a light emitting device, the method comprising the steps of: preparing a light emitting element for emitting light having a predetermined peak wavelength; preparing large phosphor particles for absorbing light emitted from the light emitting element and for emitting light having a different peak wavelength from that of the light emitted from the light emitting element; preparing small phosphor particles, which have a smaller particle diameter than that of the large phosphor particles, for absorbing light emitted from the light emitting element and for emitting light having a different peak wavelength from that of the light emitted from the light emitting element; causing the large phosphor particles to be adsorbed on the surface of the light emitting element to form a layer of the large phosphor particles thereon; and sealing the light emitting element and the large phosphor particles by means of a sealing member containing the small phosphor particles.

In this method for producing a light emitting device, the large phosphor particles are preferably adsorbed by electrostatic adsorption. The large phosphor particles preferably have a particle diameter of not less than 10 μm and of less than 50 μm, and more preferably have a particle diameter of 20 to 40 μm. The small phosphor particles preferably have a particle diameter of not less than 1 μm and of less than 10 μm, and more preferably have a particle diameter of 3 to 8 μm. The small phosphor particles are preferably dispersed in the sealing member.

According to another aspect of the present invention, a light emitting device comprises: a mounting portion having a recessed portion; a light emitting element, mounted on a bottom face of the recessed portion of the mounting portion, for emitting light having a predetermined peak wavelength; a layer of large phosphor particles, formed on the light emitting element, for absorbing light emitted from the light emitting element and for emitting light having a different peak wavelength from that of the light emitted from the light emitting element; small phosphor particles, which have a smaller particle diameter than that of the large phosphor particles, for absorbing light emitted from the light emitting element and for emitting light having a different peak wavelength from that of the light emitted from the light emitting element; and a sealing member, in which the small phosphor particles are dispersed, for sealing the light emitting element and the layer of large phosphor particles in the recessed portion of the mounting portion, wherein a difference between the maximum and minimum values of correlated color temperatures is not greater than 500K when the correlated color temperatures of light emitted from the surface of the sealing member are measured every 10° in the range of from 10° to 170° with respect to the tangent plane at the center of the surface of the sealing member. If the difference between the maximum and minimum values of correlated color temperatures is not greater than 500K, it is possible to emit uniform white light in various directions, so that the light emitting device can be used as a light source for illumination.

In this light emitting device, the difference between the maximum and minimum values of correlated color temperatures is preferably 300K or less. If the difference between the maximum and minimum values of correlated color temperatures is 300K or less, it is possible to further decrease the irregularity in color, so that the light emitting device can be used as a spot illumination device. The large phosphor particles preferably have a particle diameter of not less than 10 μm and of less than 50 μm, and more preferably have a particle diameter of 20 to 40 μm. The small phosphor particles preferably have a particle diameter of not less than 1 μm and of less than 10 μm, and more preferably have a particle diameter of 3 to 8 μm. The light emitting device preferably has a general color rendering index Ra of not less than 90. If the general color rendering index Ra is not less than 90, when an object is irradiated with light emitted from the light emitting device, the color of the object visible by viewers approaches the color of the object visible by viewers when the object is irradiated with sunlight, and the color reproducibility is good, so that the light emitting device is suitable for a light source for illumination.

According to a further aspect of the present invention, there is provided a method for producing a light emitting device, the method comprising the steps of: preparing a light emitting element for emitting light having a predetermined peak wavelength; preparing large phosphor particles for absorbing light emitted from the light emitting element and for emitting light having a longer peak wavelength than that of the light emitted from the light emitting element; preparing small phosphor particles, which have a smaller particle diameter than that of the large phosphor particles, for absorbing at least one of light emitted from the large phosphor particles and light emitted from the light emitting element and for emitting light having a longer peak wavelength than that of the at least one of the light emitted from the large phosphor particles and the light emitted from the light emitting element; causing the large phosphor particles to be adsorbed on the surface of the light emitting element to form a layer of the large phosphor particles thereon; and sealing the light emitting element and the large phosphor particles by means of a sealing member containing the small phosphor particles.

In this method for producing a light emitting device, the large phosphor particles are preferably adsorbed by electrostatic adsorption. The large phosphor particles preferably have a particle diameter of not less than 10 μm and of less than 50 μm, and more preferably have a particle diameter of 20 to 40 μm. The small phosphor particles preferably have a particle diameter of not less than 1 μm and of less than 10 μm, and more preferably have a particle diameter of 2 to 8 μm. Preferably, the light emitting element is a light emitting element for emitting light having a peak wavelength in the wavelength range of from 420 nm to less than 490 nm, the large phosphor particles are phosphor particles for emitting light having a peak wavelength in the wavelength range of from 490 nm to less than 590 nm, and the small phosphor particles are phosphor particles for emitting light having a peak wavelength in the wavelength range of from 590 nm to 780 nm. The small phosphor particles are preferably dispersed in the sealing member.

According to a still further aspect of the present invention, a light emitting device comprises: a mounting portion having a recessed portion; a light emitting element, mounted on a bottom face of the recessed portion of the mounting portion, for emitting light having a predetermined peak wavelength; a layer of large phosphor particles, formed on the light emitting element, for absorbing light emitted from the light emitting element and for emitting light having a longer peak wavelength than that of the light emitted from the light emitting element; small phosphor particles, which have a smaller particle diameter than that of the large phosphor particles, for absorbing at least one of light emitted from the large phosphor particles and light emitted from the light emitting element and for emitting light having a longer peak wavelength than that of the at least one of the light emitted from the large phosphor particles and the light emitted from the light emitting element; and a sealing member, in which the small phosphor particles are dispersed, for sealing the light emitting element and the layer of large phosphor particles in the recessed portion of the mounting portion, wherein a difference between the maximum and minimum values of correlated color temperatures is not greater than 500K when the correlated color temperatures of light emitted from the surface of the sealing member are measured every 10° in the range of from 10° to 170° with respect to the tangent plane at the center of the surface of the sealing member. If the difference between the maximum and minimum values of correlated color temperatures is not greater than 500K, it is possible to emit uniform white light in various directions, so that the light emitting device can be used as a light source for illumination.

In this light emitting device, the difference between the maximum and minimum values of correlated color temperatures is preferably 300K or less. If the difference between the maximum and minimum values of correlated color temperatures is 300K or less, it is possible to further decrease the irregularity in color, so that the light emitting device can be used as a spot illumination device. The large phosphor particles preferably have a particle diameter of not less than 10 μm and of less than 50 μm, and more preferably have a particle diameter of 20 to 40 μm. The small phosphor particles preferably have a particle diameter of not less than 1 μm and of less than 10 μm, and more preferably have a particle diameter of 3 to 8 μm. Preferably, the light emitting element is a light emitting element for emitting light having a peak wavelength in the wavelength range of from 420 nm to less than 490 nm, the large phosphor particles are phosphor particles for emitting light having a peak wavelength in the wavelength range of from 490 nm to less than 590 nm, and the small phosphor particles are phosphor particles for emitting light having a peak wavelength in the wavelength range of from 590 nm to 780 nm. The light emitting device preferably has a general color rendering index Ra of not less than 90. If the general color rendering index Ra is not less than 90, when an object is irradiated with light emitted from the light emitting device, the color of the object visible by viewers approaches the color of the object visible by viewers when the object is irradiated with sunlight, and the color reproducibility is good, so that the light emitting device is suitable for a light source for illumination.

According to the present invention, it is possible to produce a light emitting device which has a high emission power, a small irregularity in color and good color rendering properties. It is also possible to produce a light emitting device which has a high emission power, a small irregularity in color and good color rendering properties and which can reduce the irregularity in color regardless of the shape of a sealing member.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a light emitting device and a method for producing the same according to the present invention will be described below in detail.

[First Preferred Embodiment]

Figure 1:
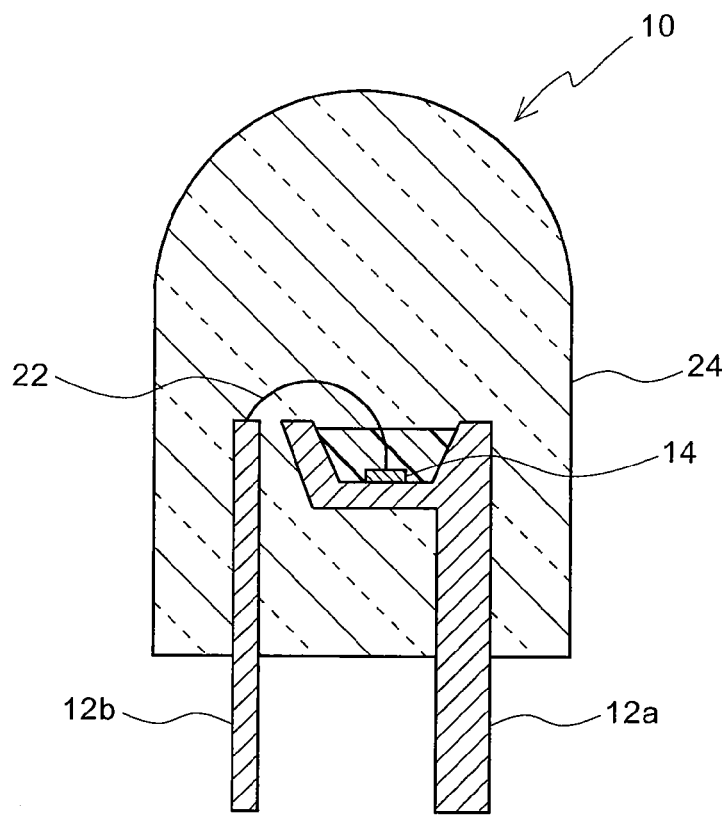
FIG. 1 is a sectional view schematically showing the preferred embodiment of a light emitting device according to the present invention.
Figure 2:
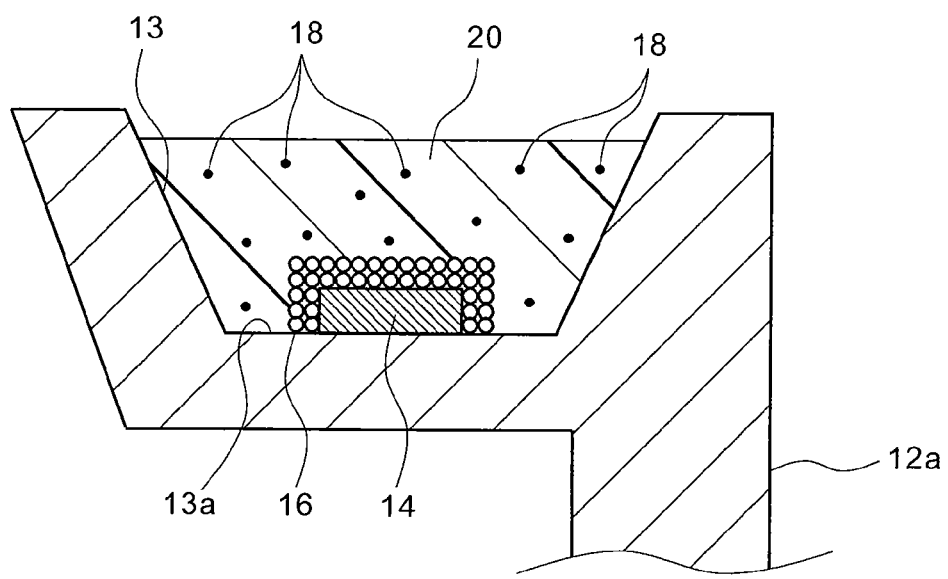
FIG. 2 is an enlarged sectional view of a cup portion of one lead frame on which a light emitting element of the light emitting device of FIG. 1 is mounted.

FIG. 1 is a sectional view schematically showing the first preferred embodiment of a light emitting device according to the present invention, and FIG. 2 is an enlarged sectional view of a cup portion of one of a pair of lead frames, on which a light emitting element of the light emitting device of FIG. 1 is mounted. As shown in FIGS. 1 and 2, the light emitting device 10 in this preferred embodiment comprises: a pair of lead frames 12a and 12b arranged at an interval; a light emitting element 14 which is mounted on the bottom face 13a of a cup (recessed portion) 13 formed in the tip end portion of one lead frame 12a; large phosphor particles 16 which are arranged so as to cover the surface of the light emitting element 14; a sealing member 20 containing small phosphor particles 18, which is filled in the cup 13 of the lead frame 12a so as to cover the large phosphor particles 16; and a transparent mold member 24 which covers the tip end portions of the lead frames 12a and 12b.

Furthermore, the bottom face of the light emitting element 14 has one of a pair of electrodes (not shown), e.g., an Au—Sn electrode, and the top face of the light emitting element 14 has the other electrode, e.g., an Au electrode. The electrode of the bottom face of the light emitting element 14 is electrically connected to the bottom face 13a of the cup 13 of the one lead frame 12a by die bonding, and the electrode of the top face of the light emitting element 14 is electrically connected to the other lead frame 12b by a conductive wire 22, such as a gold wire.

The light emitting element 14 may be a blue LED chip of, e.g., a semiconductor crystal of gallium nitride, which is capable of emitting visible light having a peak wavelength of 420 to 490 nm in the blue or violet range. However, the LED chip capable of being used as the light emitting element 14 of a light emitting device according to the present invention should not be limited to the blue LED chip, but may be a light emitting element capable of emitting an ultraviolet light or a near-ultraviolet light. As the light emitting element 14, a LED chip having a substantially square planar shape of 0.3 to 1 square millimeters may be generally used.

Figure 3:
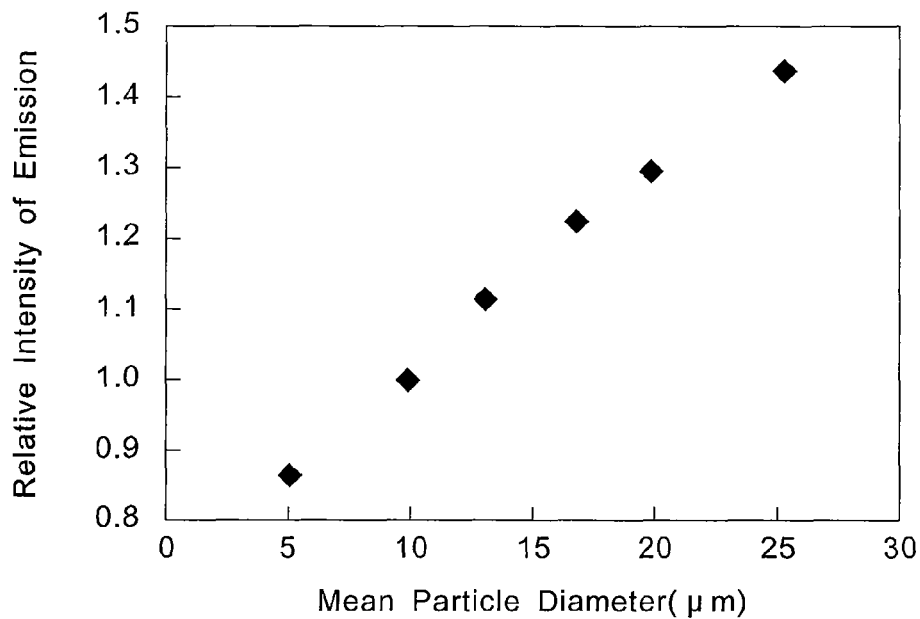
FIG. 3 is a graph showing the relationship between the mean particle diameter of phosphor particles used in a light emitting device and the relative intensity of emission of the light emitting device.

If the light emitting element 14 emits light in the blue range, the large phosphor particles 16 are preferably made of a material for emitting light in wavelength ranges from green to yellow, which have the function of enhancing luminance, in order to improve luminance. In addition, the large phosphor particles 16 and the small phosphor particles 18 are preferably made of materials for emitting light, which is white light when being observed from the outside, if the materials are combined with the light emitting element 14. As shown in FIG. 3, the relative intensity of emission increases as the mean particle diameter of phosphor particles increases, so that the mean particle diameter of the large phosphor particles 16 is preferably in the range of from about 10 μm to about 50 μm. Since the luminous efficiency generally increases as the crystallinity of phosphor particles increases, the mean particle diameter becomes 10 μm or more if a heat treatment required for sufficiently enhancing the crystallinity is carried out. Since a LED chip having a substantially square planar shape of 0.3 to 1 square millimeters is generally used as described above, the number of the large phosphor particles 16 arranged on the surface of the LED chip is only a few if the particle diameter of the large phosphor particles 16 is too large. Therefore, it is not desired that the mean particle diameter of the large phosphor particles 16 is not less than 50 μm by the following reason. That is, (1) irregular color is easily caused by the increase of the influence of the difference in luminous efficiency of each of the large phosphor particles 16, (2) irregular color is caused since the surface of the LED chip can not uniformly covered by the large phosphor particles 16, and (3) irregular color is caused since the clearances between the large phosphor particles 16 are increased so that the contrast between a wavelength converted light, which is emitted from the large phosphor particles 16 after light emitted from the LED chip impinges on the large phosphor particles 16, and light, which is emitted from the LED chip to pass through the clearances between the large phosphor particles 16, is too clear. Furthermore, the mean particle diameter of the small phosphor particles 18 is preferably about 1 to 10 μm so that it is difficult for the small phosphor particles 18 to be precipitated. In addition, the large phosphor particles 16 and the small phosphor particles 18 are preferably phosphors particles for emitting different color lights, such as yellow and red lights, but they may be phosphor particles for emitting the same color light. Furthermore, the light emitting device according to the present invention should not be limited to a light emitting device for emitting white light, but it may be applied to a light emitting device for emitting any one of all color lights.

The amount of the small phosphor particles 18 is preferably 20% by weight or less of the total amount of the large phosphor particles 16 and the small phosphor particles 18. Since the large phosphor particles 16 greatly contribute to the emission power of the light emitting device, the influence of the small phosphor particles 18 on the emission power of the light emitting device is very small even if the amount of the small phosphor particles 18 is small. Therefore, it is possible to produce a light emitting device which has good color rendering properties and a small irregularity in color while maintaining the high emission power of the light emitting device.

The lead frame 12 is preferably made of a metal, such as copper, a copper-zinc alloy or an iron-nickel alloy. The material of the sealing member 20 may be a transparent or translucent resin material, such as an epoxy resin or silicon resin, or a glass material. It is preferably a silicon resin in view of heat resistance, ultraviolet resistance and workability.

If the small phosphor particles 18 are dispersed in the sealing member 20 so as to be apart from the light emitting device 14 as the light emitting device 10 in this preferred embodiment, even if the amount of the small phosphor particles 18 is small, light directly entering the small phosphor particles 18 from the light emitting element 14, as well as light scattered by the large phosphor particles 16 surrounding the light emitting element 14, enter the small phosphor particles 18 to increase the probability that the small phosphor particles 18 are excited, so that it is possible to increase the quantity of emission of the small phosphor particles 18. In addition, light emitted from the light emitting element 14 at all angles can be mixed with light from the small phosphor particles 18, so that it is possible to greatly decrease the irregularity in color.

The light emitting device 10 in this preferred embodiment with the above described construction may be produced as follows.

First, one side of the light emitting element 14 is die-bonded (bonded and fixed) to the bottom face 13a of the cup 13 of the one lead frame 12a by means of a die bonder (not shown) to electrically connect one electrode of the light emitting element 14 to the one lead frame 12a. After the die bonding, the pair of lead frames 12a and 12b are conveyed to a wire bonder (not shown), and the other electrode of the light emitting element 14 is wire-bonded to the other lead frame 12b by means of the conductive wire 22, such as a gold wire, to be electrically connected thereto.

Figure 4:
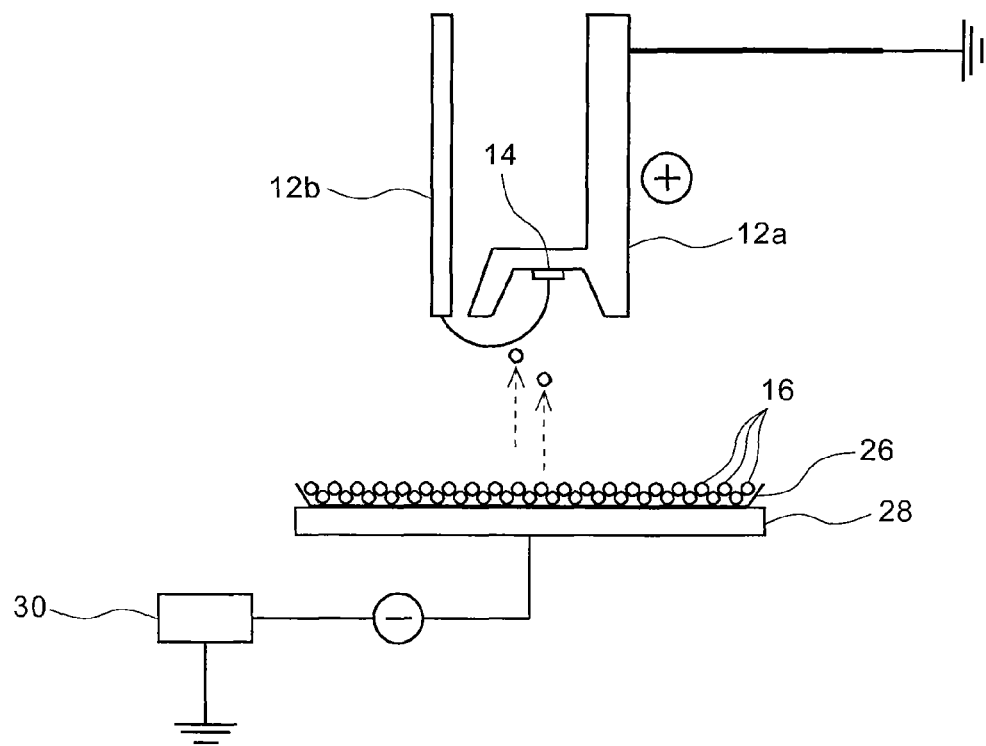
FIG. 4 is an illustration for explaining an electrostatic adsorption process for large phosphor particles in the preferred embodiment of a method for producing a light emitting device according to the present invention.

Then, the pair of lead frames 12a and 12b are conveyed to an electrostatic adsorber, and the large phosphor particles 16 are electrostatically adsorbed on the surface of the light emitting element 14, which is die-bonded to the cup 13 of the lead frame 12a, to uniformly form a wavelength converting layer of the large phosphor particles 16 on the surface of the light emitting element 14. That is, as shown in FIG. 4, after the large phosphor particles 16 are put on a metal tray 26 which is arranged on a metal plate 28, the lead frames 12a and 12b are arranged above the metal tray 26 by 10 mm so that the opening of the cup 13 of the lead frame 12a faces the metal tray 26, and the lead frame 12a is grounded by wiring. Then, a voltage of −10 kV is applied to the metal plate 28 by means of a direct voltage source 30 to produce a potential difference of 10 kV between the metal plate 28 and the lead frame 12a. Thus, the large phosphor particles 16 on the metal tray 26 arranged on the metal plate 28 are charged to be negative, so that the negative particles are allowed to be adsorbed on the positively charged light emitting element 14. Thus, a layer of the large phosphor particles 16 is formed on the light emitting element 14 in the cup 13 until the layer has such a thickness that a target color temperature is obtained by the electrostatic adsorption. In the electrostatic adsorption, in order to prevent color temperature from being changed in accordance with the observation angles, i.e., in order to make color temperature uniform even if the observation angle is changed, the layer of the large phosphor particles 16 for emitting light having the function of enhancing luminance is formed on the surface of the light emitting element 14 so as to have a constant thickness. Furthermore, while the large phosphor particles 16 have been electrostatically adsorbed on the surface of the light emitting element 14 in this preferred embodiment, another adsorbing method may be used if the large phosphor particles 16 can be formed on the surface of the light emitting element 14 so as to have a constant thickness.

Then, the pair of lead frames 12a and 12b are conveyed to a molding machine (not shown), and the small phosphor particles 18 and the sealing member 20 are injected into the cup 13 of the lead frame 12a by means of the dispenser of the molding machine. Thus, the large phosphor particles 16 are held by the sealing member 20 in which the small phosphor particles 18 are dispersed. When phosphor particles for emitting light in the yellow range are used as the large phosphor particles 16 and when phosphor particles for emitting light in the red range are used as the small phosphor particles 18, if the amount of the small phosphor particles 18 is about 1 to 20% by weight with respect to the amount of the large phosphor particles 16, the most part of phosphor particles to be used are the large phosphor particles 16 for emitting light in the yellow range. Since the layer of the large phosphor particles 16 can be formed so as to have a constant thickness, it is possible to reduce the irregularity in color caused by the difference in distance, by which light from the light emitting element 14 passes through the layer of the phosphor particles. If the small phosphor particles 18 for emitting light in the red range are mixed with the resin to be applied around the large phosphor particles 16, which are adsorbed on the surface of the light emitting element 14 and which are designed to emit light in the yellow range, it is possible to finely control the amount of the small phosphor particles 18 to be applied, so that it is possible to control color temperature and color rendering properties.

Finally, after the lead frames 12a and 12b are soaked in a molding flask (not shown) into which a molding material is previously injected, the molding flask is removed to cure the resin, so that it is possible to produce a shell-shaped light emitting device as shown in FIG. 1.

Thus, the optical path length, by which light emitted from the light emitting element 14 passes through the large phosphor particles 16 having the function of enhancing luminance, can be constant, and the quantity of wavelength converted light in the layer of the large phosphor particles 16 serving as a wavelength converting layer can be constant, so that it is possible to produce a light emitting device for emitting white light having no irregular color. In addition, the amount of the small phosphor particles 18 added to the resin can be decreased to uniformly disperse the small phosphor particles 18 in the resin, so that it is also possible to improve color rendering properties.

[Second Preferred Embodiment]

Since a light emitting device and a method for producing the same in the second preferred embodiment are substantially the same as those in the first preferred embodiment, except for the preferred materials of the large phosphor particles 16 and small phosphor particles 18, the duplicate descriptions thereof are omitted.

Although the large phosphor particles 16 and the small phosphor particles 18 may be made of the same material or different materials, they may be made of such materials that light observed from the outside becomes white light if they are combined with the light emitting element 14.

Furthermore, if a resin material is used as the material of the sealing member 20, it is difficult for the phosphor particles to be precipitated, so that it is possible to prevent irregular color due to the precipitation of the phosphor particles in the resin, since the phosphor particles to be dispersed in the resin are the small phosphor particles 18.

Examples of a light emitting device and a method for producing the same according to the present invention will be described below in detail.

EXAMPLE

First, a blue LED chip (having an active layer of InGaN and a luminous peak wavelength of 460 nm) serving as the light emitting element 14 was arranged in the cup 13 of one lead frame 12a to be die-bonded, and wire-bonded. In addition, phosphor particles having a mean particle diameter ($D_{50}$) of 25 μm and expressed as $SrAl_{(1+x)}Si_{(4-x)}O_xN_{(7-x)}$:Ce ($0 \leq x \leq 1$, x=0.45) (green phosphor particles of $SrAl_{1.45}Si_{3.55}O_{0.45}N_{6.55}$:Ce) (having a luminous peak wavelength of 556 nm) were prepared as the large phosphor particles 16. Then, as shown in FIG. 4, after the large phosphor particles 16 were put on the metal tray 26 which was arranged on the metal plate 28, the lead frame 12a was arranged above the metal tray 26 by 10 mm so that the opening of the cup 13 of the lead frame 12a faced the metal tray 26, and the lead frame 12a was grounded by wiring. Then, a voltage of −10 kV was applied to the metal plate 28 to produce a potential different of 10 kV between the metal plate 28 and the lead frame 12a. Thus, the large phosphor particles 16 on the metal tray 26 arranged on the metal plate 28 are charged to be negative, so that the negative particles were allowed to be adsorbed on the positively charged blue LED chip 14. Thus, a layer of the large phosphor particles 16 was formed on the blue LED chip 14 in the cup 13 by the electrostatic adsorption until the layer had a thickness required for obtaining a target color temperature.

Moreover, red phosphor particles of $CaAlSiN_3$:Eu having a mean particle diameter ($D_{50}$) of 7 μm (having a luminous peak wavelength of 659 nm) were prepared as the small phosphor particles 18. The small phosphor particles 18 and a precipitation inhibitor of $SiO_2$ having a particle diameter of 7 nm were mixed with a silicon resin (SCR-1011 produced by Shin-Etsu Chemical Co., Ltd.) having a viscosity of 350 mPa·s to be injected into the cup 13 of the lead frame 12a, and then, the resin was cured to seal the large phosphor particles 16 with the sealing member 20 in which the small phosphor particles 18 were dispersed.

Figure 5:
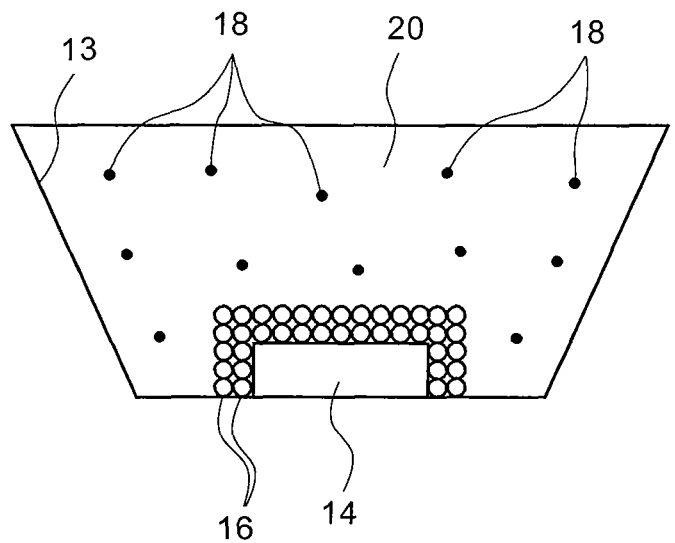
FIG. 5 is an illustration for explaining the structure in a cup of a lead frame of a light emitting device in Example.
Figure 20:
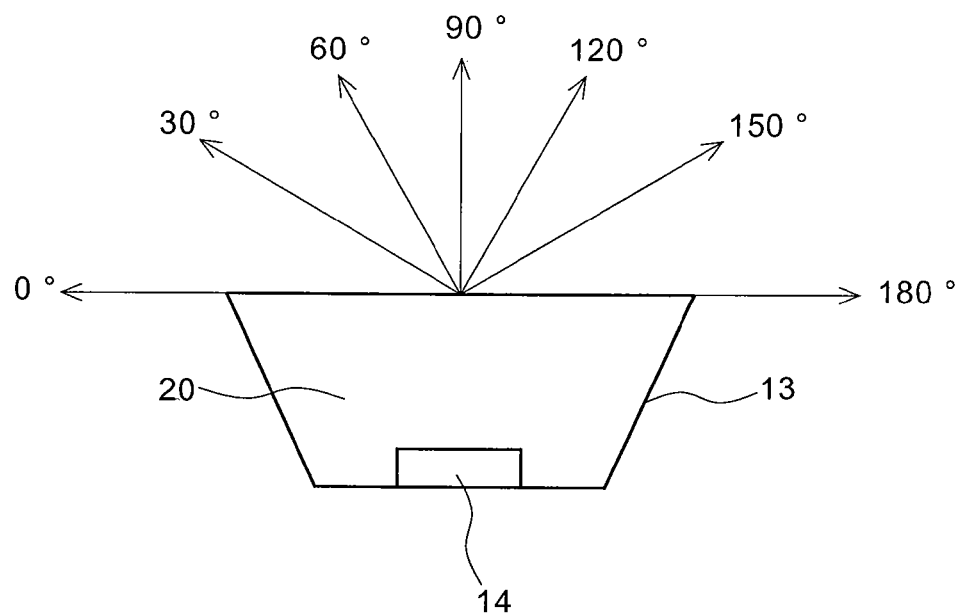
FIG. 20 is an illustration for explaining the observation angle for correlated color temperature.

Thus, a light emitting device having the structure in the cup 13 shown in FIG. 5 was produced, and the color rendering index of the light emitting device was measured. In addition, in order to evaluate the irregularity in color (color temperature distribution) of the light emitting device, the correlated color temperature thereof was measured with respect to observation angles on the basis of JIS Z8726. That is, since the irregularity in color increases if light emitted from the light emitting device is visible as a different light in accordance with angles at which a viewer is arranged, it is possible to evaluate the irregularity in color if correlated color temperatures are measured with respect of various observation angles to obtain the difference between the maximum and minimum values thereof (color temperature range). As shown in FIG. 20, the measurement of the correlated color temperature with respect to observation angles was carried out by measuring the correlated color temperature of light, which was emitted from the surface of the sealing member 20, every 10° in the range of from 10° to 170° with respect to the tangent plane at the center of the surface of the sealing member 20. Furthermore, the correlated color temperature was measured on the basis of JIS Z8725 by transmitting light, which was irradiated on a detecting element being apart from the light emitting device by 1.4 to 1.5 m, to a measuring apparatus (PMA-11 (C7473-36) produced by Hamamatsu Photonics Co., Ltd.) via an optical fiber.

Figure 6:
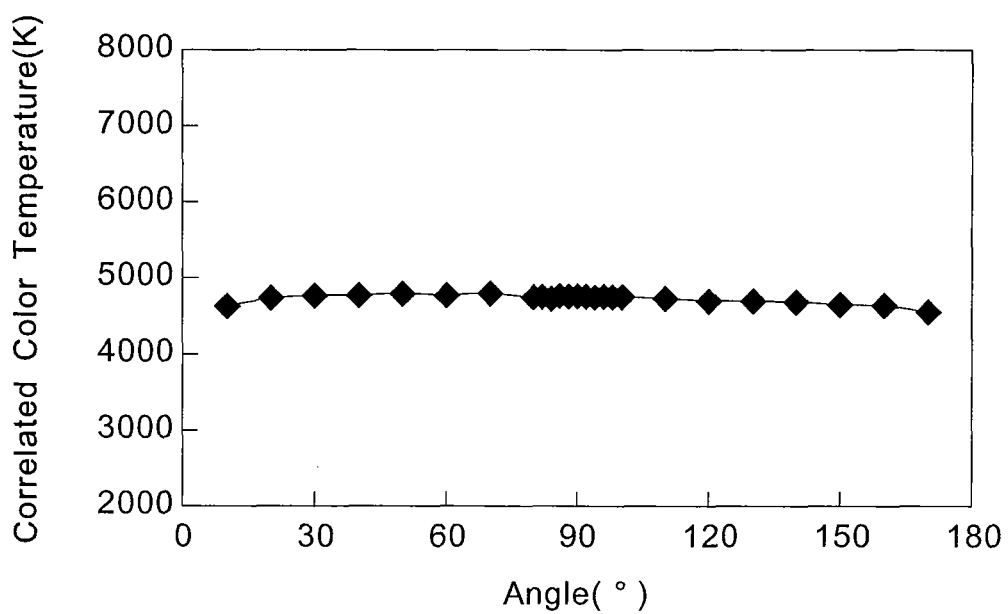
FIG. 6 is a graph showing the relationship between the observation angle and correlated color temperature of the light emitting device in Example.
Figure 7:
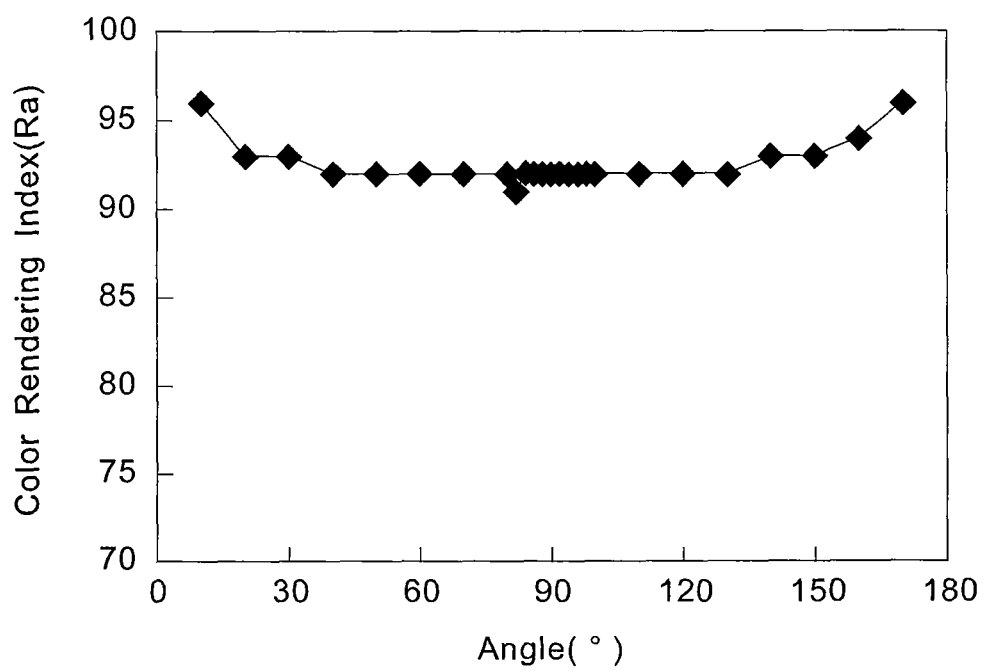
FIG. 7 is a graph showing the relationship between the observation angle and color rendering index of the light emitting device in Example.
Figure 21:
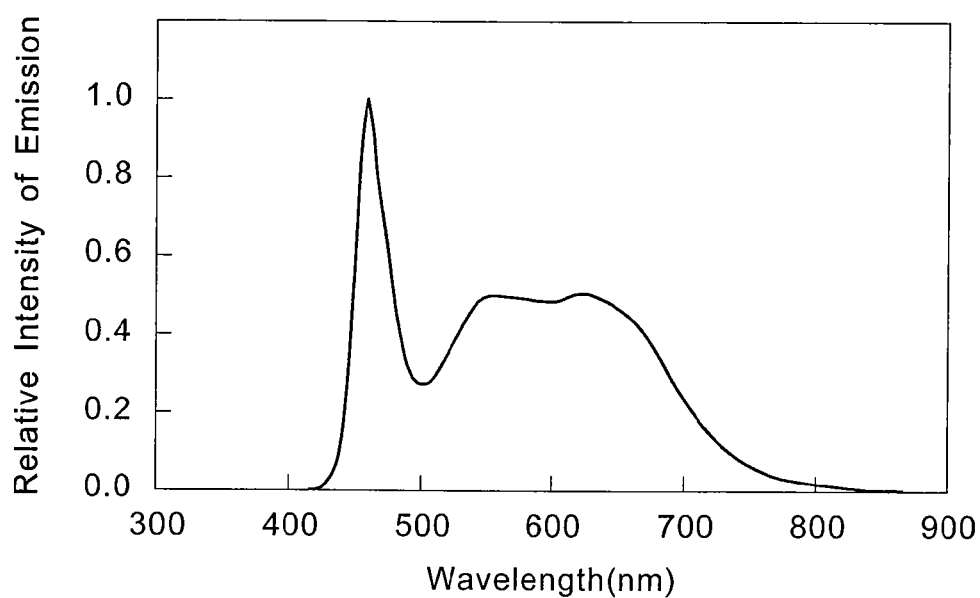
FIG. 21 is a graph showing emission spectrum at the observation angle of 90° in the light emitting device in Example.

As a result, as shown in FIG. 6 and Table 1, the correlated color temperature at the observation angle of 90° was about 4800K, and the color temperature range was 233 K, so that the irregularity in color was very small. The general color rendering index Ra at the observation angle of 90° was a high value of 90, and color rendering properties were good, so that the color reproducibility was good. As shown in Table 2, special color rendering indexes R9-R15 were not less than 60, so that the colors of materials being visible by viewers approach those in the presence of sunlight. Thus, the light emitting device produced in the Example was preferred. In particular, the color reproducibility with respect to red was good since R9 was a high value of 95, and the color reproducibility with respect to the skin color of Japanese was good since R15 was a high value of 91. Therefore, the light emitting device in the Example can be used as an excellent light source for illumination. Moreover, as shown in FIG. 7 and Table 3, the variation in general color rendering index Ra with respect to observation angles was very small, and the color rendering index at an observation angle of 10 to 170° was a high value of not less than 90. Furthermore, if an object is placed under an illumination device which uses a light emitting device having a large variation in general color rendering index Ra, the color of the object is viewed so as to be changed in accordance with angles of light from the illumination device. However, in the case of a light emitting device having a small variation in general color rendering index Ra, the degree of the variation in color of the object viewed in accordance with angles of light from the illumination device is decreased. Furthermore, FIG. 21 shows the results (emission spectrum) of measured intensities of emission with respect to wavelengths at the observation angle of 90° in the light emitting device in this example.

TABLE 1

| angle (°) | Correlated Color Temperature (K) | | | |
|---|---|---|---|---|
| | Example | Comp. 1 | Comp. 2 | Comp. 3 |
| 10 | 4634 | 4601 | 2808 | 4711 |
| 20 | 4731 | 4755 | 3021 | 4752 |
| 30 | 4772 | 4905 | 3702 | 4803 |
| 40 | 4785 | 4983 | 4212 | 4910 |
| 50 | 4800 | 5022 | 4831 | 5204 |
| 60 | 4786 | 5055 | 4903 | 5602 |
| 70 | 4799 | 5087 | 4989 | 5988 |
| 80 | 4759 | 5147 | 5104 | 6584 |
| 82 | 4776 | 5135 | 5112 | 6680 |
| 84 | 4733 | 5146 | 5130 | 6705 |
| 86 | 4788 | 5164 | 5150 | 6686 |
| 88 | 4781 | 5183 | 5182 | 6653 |
| 90 | 4779 | 5211 | 5208 | 6709 |
| 92 | 4778 | 5186 | 5171 | 6682 |
| 94 | 4753 | 5167 | 5153 | 6607 |
| 96 | 4778 | 5155 | 5165 | 6523 |
| 98 | 4745 | 5148 | 5132 | 6502 |
| 100 | 4763 | 5135 | 5101 | 6402 |
| 110 | 4741 | 5092 | 5082 | 6000 |
| 120 | 4695 | 5041 | 5055 | 5605 |
| 130 | 4696 | 4955 | 4902 | 5199 |
| 140 | 4688 | 4883 | 4501 | 4987 |
| 150 | 4647 | 4802 | 3986 | 4803 |
| 160 | 4644 | 4703 | 3187 | 4750 |
| 170 | 4567 | 4561 | 2852 | 4709 |

TABLE 2

| Special Color Rendering Index | | | | | | | | | | | | | | | |
|---|---|---|---|---|---|---|---|---|---|---|---|---|---|---|---|
| R1 | R2 | R3 | R4 | R5 | R6 | R7 | R8 | R9 | R10 | R11 | R12 | R13 | R14 | R15 | R16 |
| 95 | 90 | 90 | 83 | 92 | 88 | 85 | 89 | 95 | 86 | 81 | 66 | 93 | 96 | 91 | 54 |

TABLE 3

| angle (°) | Color Rendering Index |
|---|---|
| 10 | 96 |
| 20 | 93 |
| 30 | 93 |
| 40 | 92 |
| 50 | 92 |
| 60 | 92 |
| 70 | 92 |
| 80 | 92 |
| 82 | 91 |
| 84 | 92 |
| 86 | 92 |
| 88 | 92 |
| 90 | 92 |
| 92 | 92 |
| 94 | 92 |
| 96 | 92 |
| 98 | 92 |
| 100 | 92 |
| 110 | 92 |
| 120 | 92 |
| 130 | 92 |
| 140 | 93 |
| 150 | 93 |
| 160 | 94 |
| 170 | 96 |

Comparative Example 1

Figure 8:
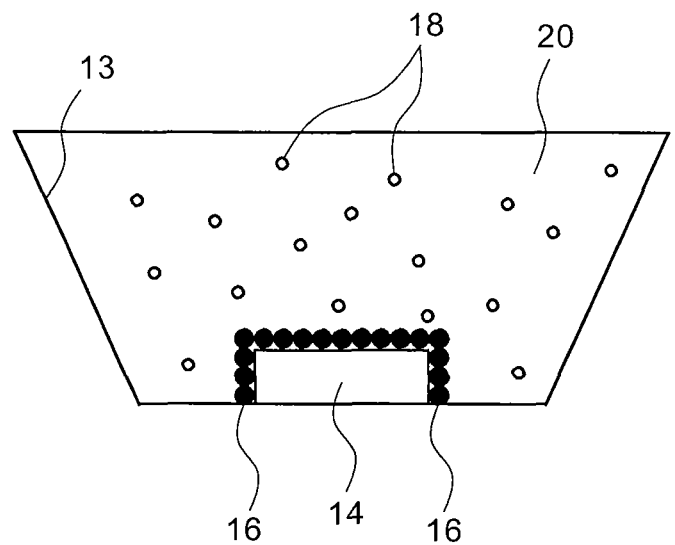
FIG. 8 is an illustration for explaining the structure in a cup of a lead frame of a light emitting device in Comparative Example 1.

A light emitting device having the structure in the cup 13 shown in FIG. 8 was produced by the same method as that in Example, except that red phosphor particles (having a luminous peak wavelength of 660 nm) of $CaAlSiN_3$:Eu having a mean particle diameter ($D_{50}$) of 25 μm were used in place of the large phosphor particles 16 in Example, and that green phosphor particles (having a luminous peak wavelength of 557 nm) of $SrAl_{1.42}Si_{3.58}O_{0.42}N_{6.58}$:Ce having a mean particle diameter ($D_{50}$) of 9 μm were used in place of the small phosphor particles 18 in Example.

Figure 9:
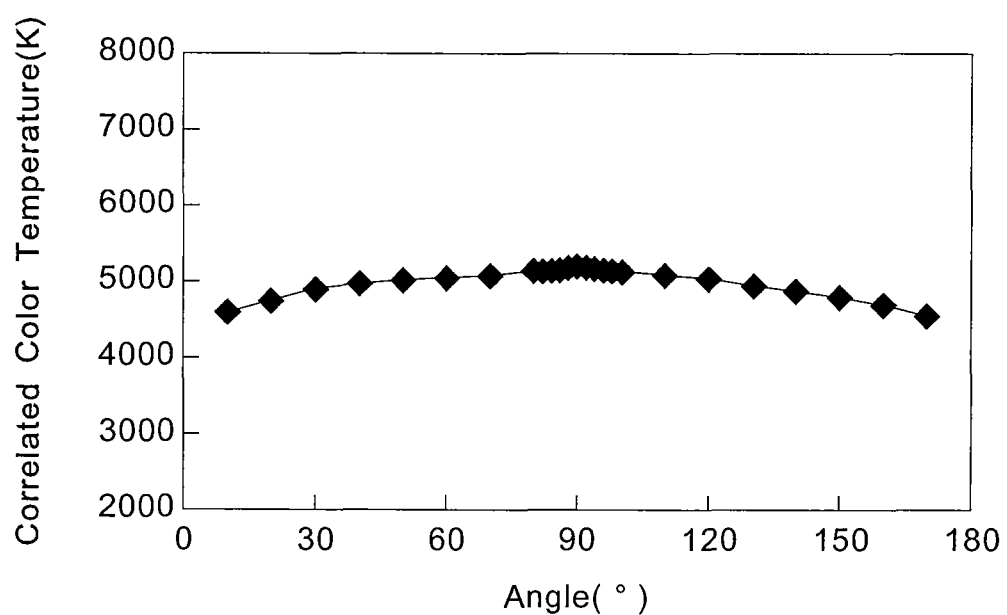
FIG. 9 is a graph showing the relationship between the observation angle and correlated color temperature of the light emitting device in Comparative Example 1.

With respect to the light emitting device thus produced, the color rendering index and the correlated color temperatures with respect to observation angles were measured. As a result, the general color rendering index Ra was 90, so that color rendering properties were good. However, as shown in FIG. 9 and Table 1, the correlated color temperature at the observation angle of 90° was about 5200K, and the color temperature range was 650K, so that the irregularity in color was large.

Comparative Example 2

Figure 10:
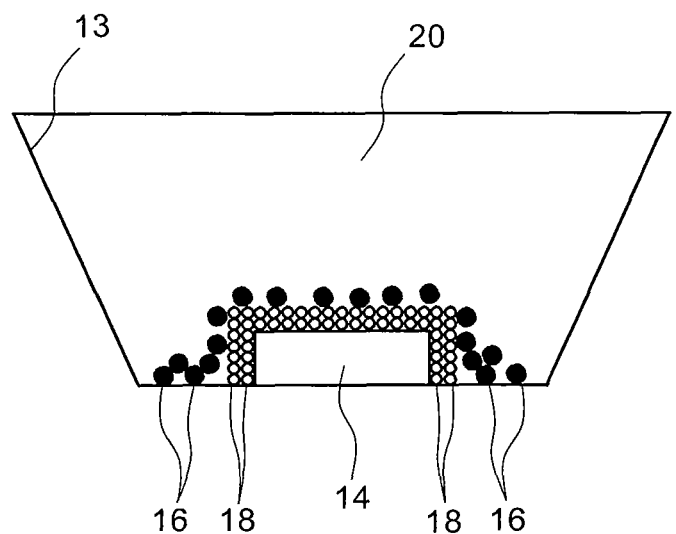
FIG. 10 is an illustration for explaining the structure in a cup of a lead frame of a light emitting device in Comparative Example 2.

A light emitting device having the structure in the cup 13 shown in FIG. 10 was produced by the same method as that in Example, except that green phosphor particles (having a luminous peak wavelength of 557 nm) of $SrAl_{1.45}Si_{3.55}O_{0.45}N_{6.55}$: Ce having a mean particle diameter ($D_{50}$) of 9 μm were used as the small phosphor particles 18 in place of the large phosphor particles 16 in Example, and that red phosphor particles (having a luminous peak wavelength of 660 nm) of $CaAlSiN_3$:Eu having a mean particle diameter ($D_{50}$) of 25 μm were used as the large phosphor particles 16 in place of the small phosphor particles 18 in Example.

Figure 11:
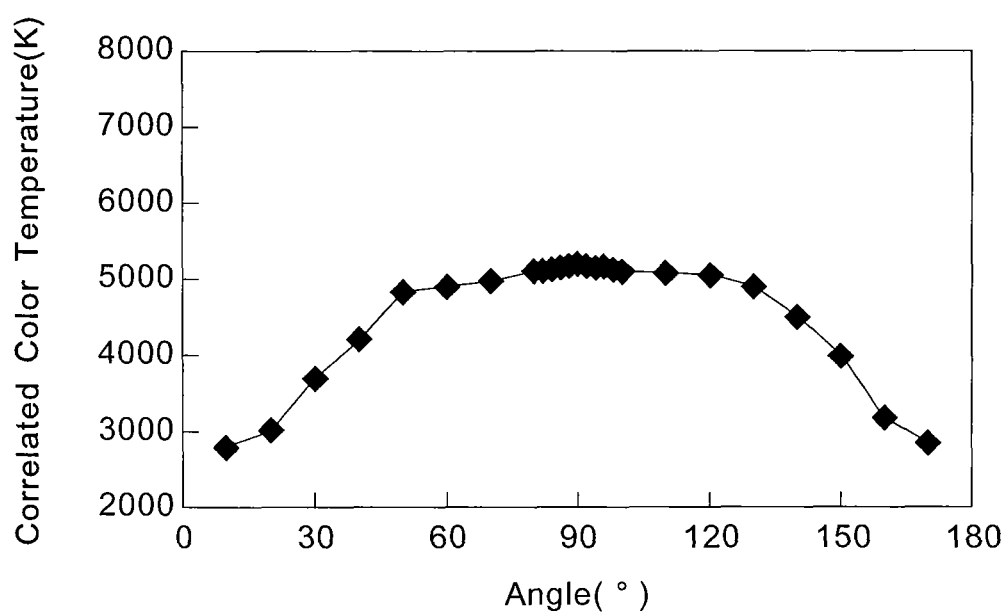
FIG. 11 is a graph showing the relationship between the observation angle and correlated color temperature of the light emitting device in Comparative Example 2.

With respect to the light emitting device thus produced, the color rendering index and the correlated color temperatures with respect to observation angles were measured. As a result, the general color rendering index Ra was 90, so that color rendering properties were good. However, as shown in FIG. 11 and Table 1, the correlated color temperature at the observation angle of 90° was about 5200K, and the color temperature range was 2400K, so that the irregularity in color was very large.

Comparative Example 3

Figure 12:
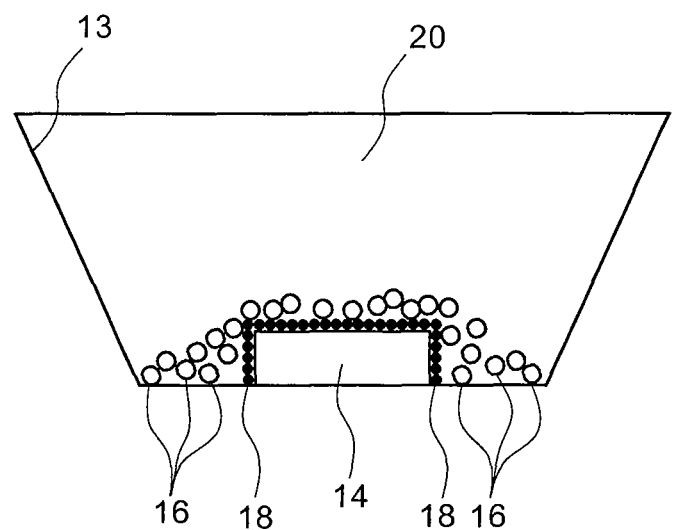
FIG. 12 is an illustration for explaining the structure in a cup of a lead frame of a light emitting device in Comparative Example 3.

A light emitting device having the structure in the cup 13 shown in FIG. 12 was produced by the same method as that in Example, except that red phosphor particles (having a luminous peak wavelength of 659 nm) of $CaAlSiN_3$:Eu having a mean particle diameter ($D_{50}$) of 7 μm were used as the small phosphor particles 18 in place of the large phosphor particles 16 in Example, and that green phosphor particles (having a luminous peak wavelength of 556 nm) of $SrAl_{1.25}Si_{4.5}O_{1.25}N_{7.1}$:Ce having a mean particle diameter ($D_{50}$) of 25 μm were used as the large phosphor particles 16 in place of the small phosphor particles 18 in Example.

Figure 13:
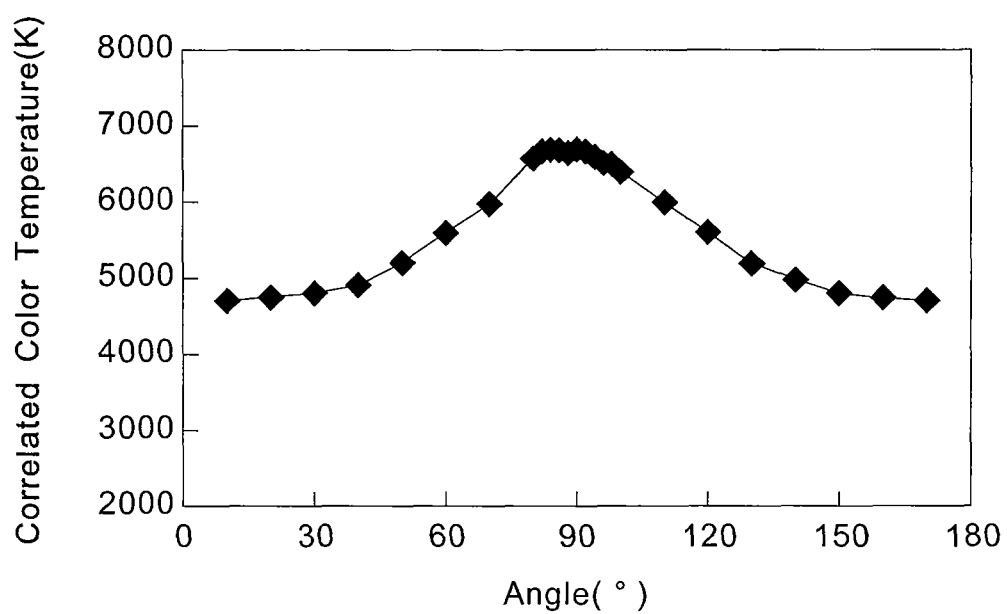
FIG. 13 is a graph showing the relationship between the observation angle and correlated color temperature of the light emitting device in Comparative Example 3.

With respect to the light emitting device thus produced, the color rendering index and the correlated color temperatures with respect to observation angles were measured. As a result, the general color rendering index Ra was 85, so that color rendering properties were good. However, as shown in FIG. 13 and Table 1, the correlated color temperature at the observation angle of 90° was about 6700K, and the color temperature range was 2000K, so that the irregularity in color was very large.

Comparative Example 4

As small phosphor particles 18' and 18, green phosphor particles of $SrAl_{1.42}Si_{3.58}O_{0.42}N_{6.58}$:Ce having a mean particle diameter ($D_{50}$) of 9 μm, and red phosphor particles of $CaAlSiN_3$:Eu having a mean particle diameter ($D_{50}$) of 7 μm were prepared. The two kinds of small phosphor particles were mixed in the same silicon resin as that in Example. Then, similar to Example, the resin was injected in the cup 13 of the lead frame 12a to be cured to seal the light emitting element 14 with the sealing member 20 containing the two kinds of small phosphor particles 18' and 18.

Figure 14:
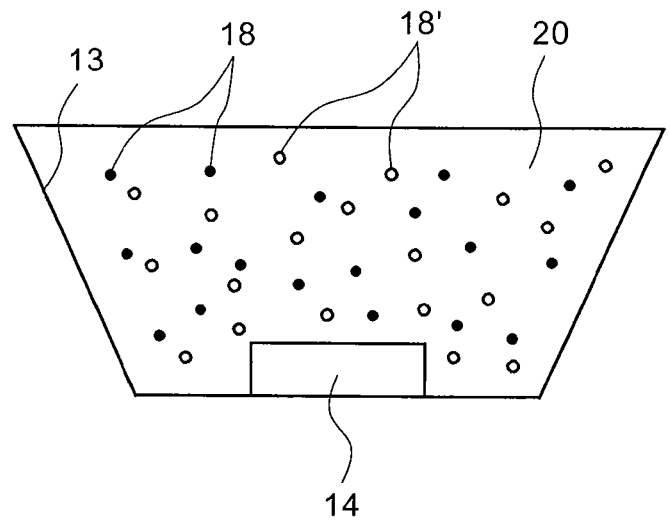
FIG. 14 is an illustration for explaining the structure in a cup of a lead frame of a light emitting device in Comparative Example 4.
Figure 15:
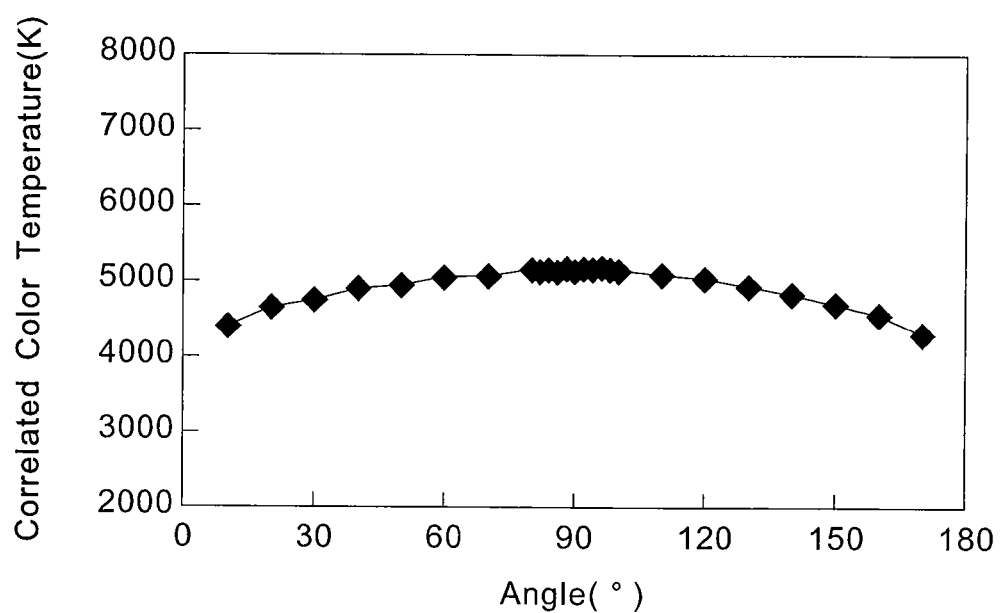
FIG. 15 is a graph showing the relationship between the observation angle and correlated color temperature of the light emitting device in Comparative Example 4.

Thus, a light emitting device having the structure in the cup 13 shown in FIG. 14 was produced. With respect to the light emitting device thus produced, the color rendering index and the correlated color temperatures with respect to observation angles were measured. As a result, the general color rendering index Ra was 92, so that color rendering properties were good. However, as shown in FIG. 15 and Table 4, the correlated color temperature at the observation angle of 90° was about 5150K, and the color temperature range was 875K, so that the irregularity in color was large.

Comparative Example 5

Green phosphor particles of $SrAl_{1.45}Si_{3.55}O_{0.45}N_{6.55}$: Ce having a mean particle diameter ($D_{50}$) of 25 μm were prepared as the large phosphor particles 16, and red phosphor particles of $CaAlSiN_3$:Eu having a mean particle diameter ($D_{50}$) of 7 μm were prepared as the small phosphor particles 18. The large phosphor particles 16 and the small phosphor particles 18 were mixed in the same silicon resin as that in Example. Then, similar to Example, the resin was injected in the cup 13 of the lead frame 12a to be cured to seal the light emitting element 14 with the sealing member 20 containing the large phosphor particles 16 and small phosphor particles 18. Furthermore, the large phosphor particles 16 were precipitated during the curing of the resin.

Figure 16:
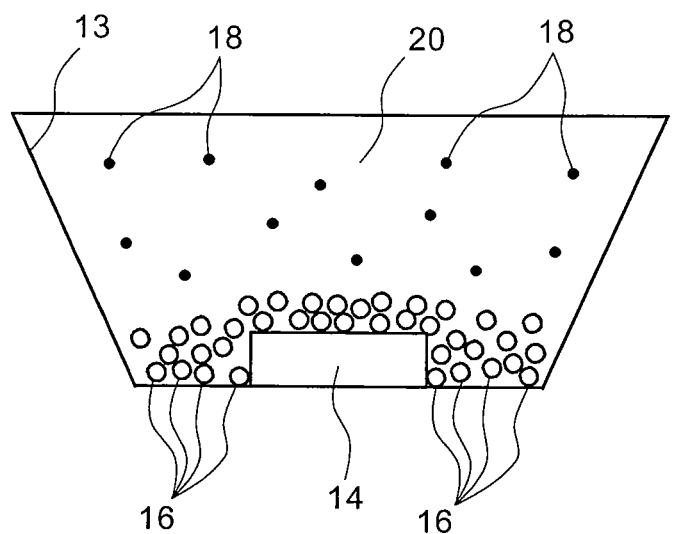
FIG. 16 is an illustration for explaining the structure in a cup of a lead frame of a light emitting device in Comparative Example 5.
Figure 17:
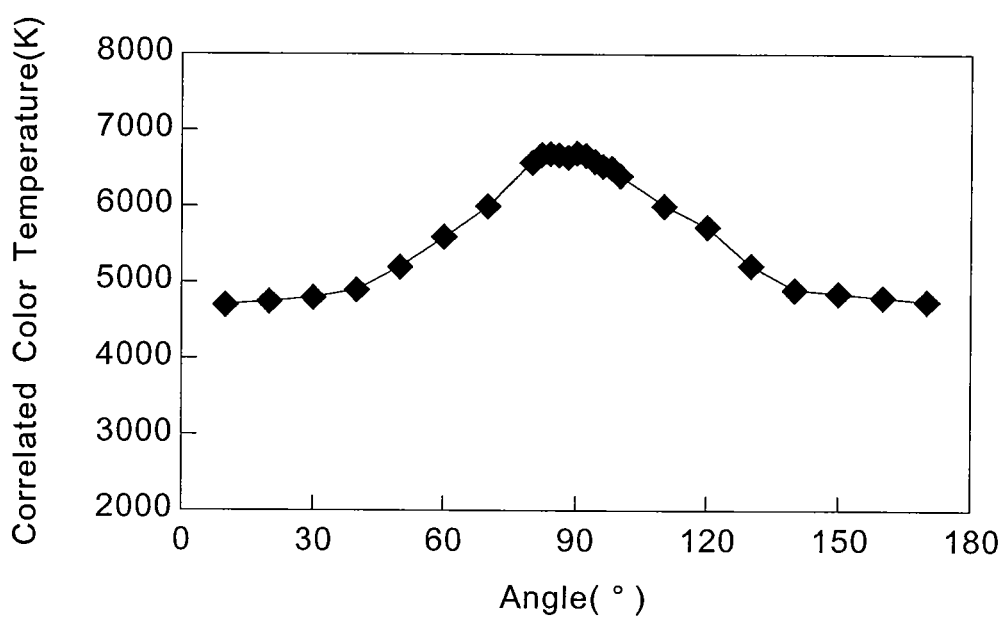
FIG. 17 is a graph showing the relationship between the observation angle and correlated color temperature of the light emitting device in Comparative Example 5.

Thus, a light emitting device having the structure in the cup 13 shown in FIG. 16 was produced. With respect to the light emitting device thus produced, the color rendering index and the correlated color temperatures with respect to observation angles were measured. As a result, the general color rendering index Ra was 90, so that color rendering properties were good. However, as shown in FIG. 17 and Table 4, the correlated color temperature at the observation angle of 90° was about 6700K, and the color temperature range was 2000K, so that the irregularity in color was very large.

Comparative Example 6

Figure 18:
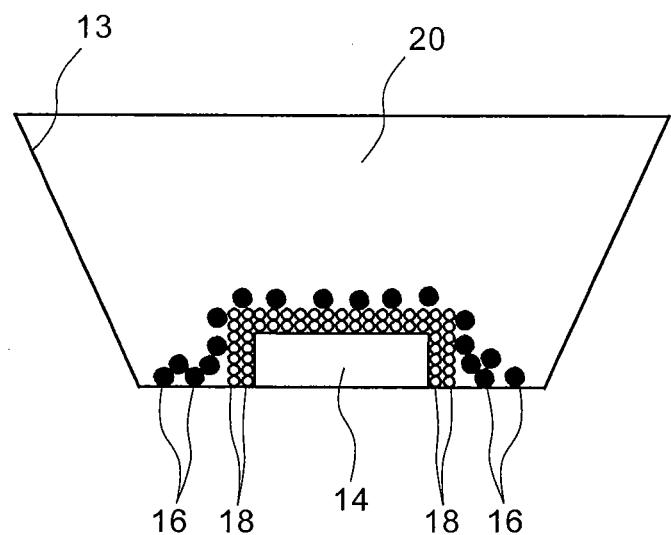
FIG. 18 is an illustration for explaining the structure in a cup of a lead frame of a light emitting device in Comparative Example 6.

A light emitting device having the structure in the cup 13 shown in FIG. 18 was produced by the same method as that in Example, except that green phosphor particles of $SrAl_{1.42}Si_{3.58}O_{0.42}N_{6.58}$: Ce having a mean particle diameter ($D_{50}$) of 9 μm were used as the small phosphor particles 18 in place of the large phosphor particles 16 in Example, and that red phosphor particles of $CaAlSiN_3$:Eu having a mean particle diameter ($D_{50}$) of 25 μm were used as the large phosphor particles 16 in place of the small phosphor particles 18 in Example.

Figure 19:
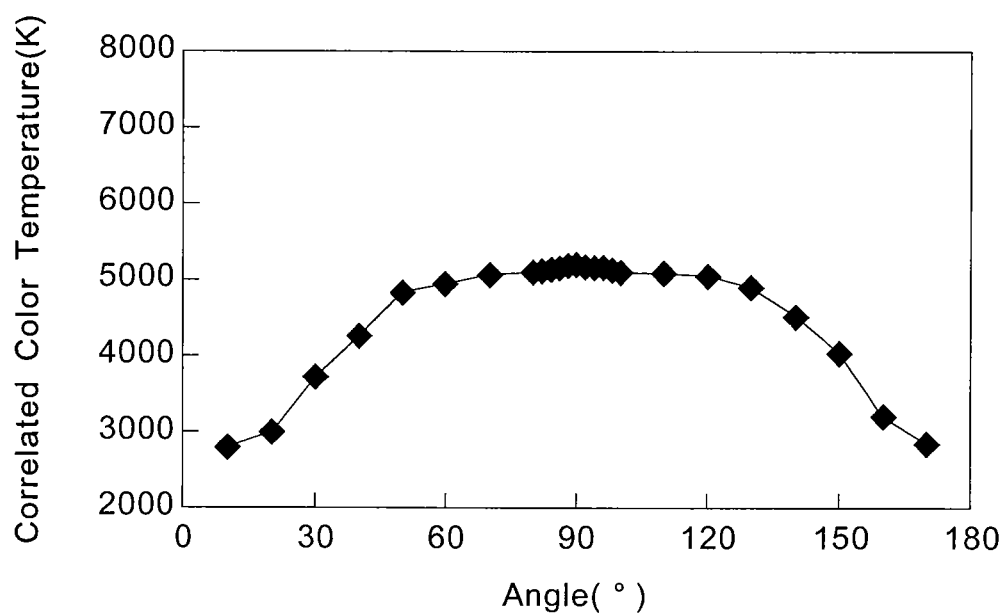
FIG. 19 is a graph showing the relationship between the observation angle and correlated color temperature of the light emitting device in Comparative Example 6.

With respect to the light emitting device thus produced, the color rendering index and the correlated color temperatures with respect to observation angles were measured. As a result, the general color rendering index Ra was 90, so that color rendering properties were good. However, as shown in FIG. 19 and Table 4, the correlated color temperature at the observation angle of 90° was about 5200K, and the color temperature range was 2400K, so that the irregularity in color was very large.

TABLE 4

| angle (°) | Correlated Color Temperature (K) | | |
| --- | --- | --- | --- |
| | Comp. 4 | Comp. 5 | Comp. 6 |
| 10 | 4401 | 4704 | 2803 |
| 20 | 4662 | 4751 | 3002 |
| 30 | 4753 | 4808 | 3721 |
| 40 | 4904 | 4905 | 4262 |
| 50 | 4957 | 5203 | 4835 |
| 60 | 5056 | 5602 | 4947 |
| 70 | 5083 | 6004 | 5063 |
| 80 | 5152 | 6582 | 5107 |
| 82 | 5145 | 6687 | 5110 |
| 84 | 5155 | 6703 | 5136 |
| 86 | 5143 | 6686 | 5155 |
| 88 | 5165 | 6653 | 5188 |
| 90 | 5146 | 6704 | 5203 |
| 92 | 5161 | 6684 | 5176 |
| 94 | 5155 | 6607 | 5159 |
| 96 | 5175 | 6528 | 5160 |
| 98 | 5152 | 6507 | 5135 |
| 100 | 5144 | 6406 | 5104 |
| 110 | 5085 | 6002 | 5088 |
| 120 | 5038 | 5736 | 5052 |
| 130 | 4936 | 5225 | 4904 |
| 140 | 4837 | 4905 | 4526 |
| 150 | 4703 | 4851 | 4039 |
| 160 | 4563 | 4803 | 3210 |
| 170 | 4300 | 4758 | 2852 |

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a light emitting device, the method comprising the steps of:
   preparing a light emitting element for emitting light having a predetermined peak wavelength;
   preparing large phosphor particles for absorbing light emitted from the light emitting element and for emitting light having a different peak wavelength from that of the light emitted from the light emitting element;
   preparing small phosphor particles, which have a smaller particle diameter than that of the large phosphor particles, for absorbing light emitted from the light emitting element and for emitting light having a different peak wavelength from that of the light emitted from the light emitting element;
   bonding one side of the light emitting element to the bottom face of a cup of one of a pair of lead frame of a metal;
   putting the large phosphor particles on a metal tray which is arranged on a metal plate;
   arranging the light emitting element, which is bonded to the bottom face of the cup of the one of the pair of lead frames, above the large phosphor particles, which are put on the metal tray, so as to face the large phosphor particles;
   applying a voltage between the metal plate and the one of the pair of lead frames to charge the light emitting element, which is arranged above the large phosphor particles, to be positive while charging the large phosphor particles to be negative to cause the large phosphor particles to be electrostatically adsorbed on the top and side faces of the light emitting element to form a layer of the large phosphor particles thereon so that the layer uniformly covers the top and side faces of the light emitting element; and
   sealing the light emitting element and the large phosphor particles by means of a sealing member containing the small phosphor particles.

2. A method for producing a light emitting device as set forth in claim 1, wherein said large phosphor particles have a particle diameter of not less than 10 μm and of less than 50 μm, and said small phosphor particles have a particle diameter of not less than 1 μm and of less than 10 μm.

3. A method for producing a light emitting device as set forth in claim 1, wherein said small phosphor particles are dispersed in said sealing member.

4. A method for producing a light emitting device, the method comprising the steps of:
   preparing a light emitting element for emitting light having a predetermined peak wavelength;
   preparing large phosphor particles for absorbing light emitted from the light emitting element and for emitting light having a longer peak wavelength than that of the light emitted from the light emitting element;
   preparing small phosphor particles, which have a smaller particle diameter than that of the large phosphor particles, for absorbing at least one of light emitted from the large phosphor particles and light emitted from the light emitting element and for emitting light having a longer peak wavelength than that of said at least one of the light emitted from the large phosphor particles and the light emitted from the light emitting element;
   bonding one side of the light emitting element to the bottom face of a cup of one of a pair of lead frame of a metal;
   putting the large phosphor particles on a metal tray which is arranged on a metal plate;
   arranging the light emitting element, which is bonded to the bottom face of the cup of the one of the pair of lead frames, above the large phosphor particles, which are put on the metal tray, so as to face the large phosphor particles;
   applying a voltage between the metal plate and the one of the pair of lead frames to charge the light emitting element, which is arranged above the large phosphor particles, to be positive while charging the large phosphor particles to be negative to cause the large phosphor particles to be electrostatically adsorbed on the top and side faces of the light emitting element to form a layer of the large phosphor particles thereon so that the layer uniformly covers the top and side faces of the light emitting element; and
   sealing the light emitting element and the large phosphor particles by means of a sealing member containing the small phosphor particles.

5. A method for producing a light emitting device as set forth in claim 4, wherein said large phosphor particles have a particle diameter of not less than 10 μm and of less than 50 μm, and said small phosphor particles have a particle diameter of not less than 1 μm and of less than 10 μm.

6. A method for producing a light emitting device as set forth in claim 4, wherein said light emitting element is a light emitting element for emitting light having a peak wavelength in the wavelength range of from 420 nm to less than 490 nm, said large phosphor particles are phosphor particles for emitting light having a peak wavelength in the wavelength range of from 490 nm to less than 590 nm, and said small phosphor particles are phosphor particles for emitting light having a peak wavelength in the wavelength range of from 590 nm to 780 nm.

7. A method for producing a light emitting device as set forth in claim 4, wherein said small phosphor particles are dispersed in said sealing member.

8. A method for producing a light emitting device, the method comprising the steps of:

preparing a light emitting element of a semiconductor crystal for emitting light having a predetermined peak wavelength;

preparing large phosphor particles for absorbing light emitted from the light emitting element and for emitting light having a different peak wavelength from that of the light emitted from the light emitting element;

preparing small phosphor particles, which have a smaller particle diameter than that of the large phosphor particles, for absorbing light emitted from the light emitting element and for emitting light having a different peak wavelength from that of the light emitted from the light emitting element;

bonding one side of the light emitting element to the bottom face of a cup of one of a pair of lead frames of a metal;

putting the large phosphor particles on a metal tray which is arranged on a metal plate;

arranging the light emitting element, which is bonded to the bottom face of the cup of the one of the pair of lead frames, above the large phosphor particles, which are put on the metal tray, so as to face the large phosphor particles;

applying a voltage between the metal plate and the one of the pair of lead frames to charge the light emitting element, which is arranged above the large phosphor particles, to be positive while charging the large phosphor particles to be negative to cause the large phosphor particles to be electrostatically adsorbed on the top and side faces of the light emitting element to form a layer of the large phosphor particles thereon so that the layer uniformly covers the top and side faces of the light emitting element; and sealing the light emitting element and the large phosphor particles by means of a sealing member containing the small phosphor particles.

9. A method for producing a light emitting device, the method comprising the steps of:

preparing a light emitting element of a semiconductor crystal for emitting light having a predetermined peak wavelength;

preparing large phosphor particles for absorbing light emitted from the light emitting element and for emitting light having a longer peak wavelength than that of the light emitted from the light emitting element;

preparing small phosphor particles, which have a smaller particle diameter than that of the large phosphor particles, for absorbing at least one of light emitted from the large phosphor particles and light emitted from the light emitting element and for emitting light having a longer peak wavelength than that of said at least one of the light emitted from the large phosphor particles and the light emitted from the light emitting element;

bonding one side of the light emitting element to the bottom face of a cup of one of a pair of lead frames of a metal;

putting the large phosphor particles on a metal tray which is arranged on a metal plate;

arranging the light emitting element, which is bonded to the bottom face of the cup of the one of the pair of lead frames, above the large phosphor particles, which are put on the metal tray, so as to face the large phosphor particles;

applying a voltage between the metal plate and the one of the pair of lead frames to charge the light emitting element, which is arranged above the large phosphor particles, to be positive while charging the large phosphor particles to be negative to cause the large phosphor particles to be electrostatically adsorbed on the top and side faces of the light emitting element to form a layer of the large phosphor particles thereon so that the layer uniformly covers the top and side faces of the light emitting element; and sealing the light emitting element and the large phosphor particles by means of a sealing member containing the small phosphor particles.

10. A method for producing a light emitting device, the method comprising the steps of:

preparing a light emitting element of a semiconductor crystal for emitting light having a predetermined peak wavelength;

preparing large phosphor particles for absorbing light emitted from the light emitting element and for emitting light having a different peak wavelength from that of the light emitted from the light emitting element;

preparing small phosphor particles, which have a smaller particle diameter than that of the large phosphor particles, for absorbing light emitted from the light emitting element and for emitting light having a different peak wavelength from that of the light emitted from the light emitting element;

die-bonding one side of the light emitting element to the bottom face of a cup of one of a pair of lead frames of a metal to electrically connect one electrode of the light emitting element to the one of the pair of lead frames;

wire-bonding the other electrode of the light emitting element to the other of the pair of lead frames to electrically connect the other electrode thereto;

putting the large phosphor particles on a metal tray which is arranged on a metal plate;

arranging the light emitting element, which is die-bonded to the bottom face of the cup of the one of the pair of lead frames, above the large phosphor particles, which are put on the metal tray, so as to face the large phosphor particles;

applying a voltage between the metal plate and the one of the pair of lead framed to charge the light emitting element, which is arranged above the large phosphor particles, to be positive while charging the large phosphor particles to be negative to cause the large phosphor particles to be electrostatically adsorbed on the top and side faces of the light emitting element to form a layer of the large phosphor particles thereon so that the layer uniformly covers the top and side faces of the light emitting element; and sealing the light emitting element and the large phosphor particles by means of a sealing member containing the small phosphor particles.

11. A method for producing a light emitting device, the method comprising the steps of:

preparing a light emitting element of a semiconductor crystal for emitting light having a predetermined peak wavelength;

preparing large phosphor particles for absorbing light emitted from the light emitting element and for emitting light having a longer peak wavelength than that of the light emitted from the light emitting element;

preparing small phosphor particles, which have a smaller particle diameter than that of the large phosphor particles, for absorbing at least one of light emitted from the large phosphor particles and light emitted from the light emitting element and for emitting light having a longer peak wavelength than that of said at least one of the light emitted from the large phosphor particles and the light emitted from the light emitting element;

die-bonding one side of the light emitting element to the bottom face of a cup of one of a pair of lead frames of a metal to electrically connect one electrode of the light emitting element to the one of the pair of lead frames;

wire-bonding the other electrode of the light emitting element to the other of the pair of lead frames to electrically connect the other electrode thereto;

putting the large phosphor particles on a metal tray which is arranged on a metal plate;

arranging the light emitting element, which is die-bonded to the bottom face of the cup of the one of the pair of lead frames, above the large phosphor particles, which are put on the metal tray, so as to face the large phosphor particles;

applying a voltage between the metal plate and the one of the pair of lead frames to charge the light emitting element, which is arranged above the large phosphor particles, to be positive while charging the large phosphor particles to be negative to cause the large phosphor particles to be electrostatically adsorbed on the top and side faces of the light emitting element to form a layer of the large phosphor particles thereon so that the layer uniformly covers the top and side faces of the light emitting element; and sealing the light emitting element and the large phosphor particles by means of a sealing member containing the small phosphor particles.

\* \* \* \* \*